US00RE47840E

(19) United States
(12) Reissued Patent
Riho

(10) Patent Number: US RE47,840 E
(45) Date of Reissued Patent: Feb. 4, 2020

(54) TESTING CIRCUITS IN STACKED WAFERS USING A CONNECTED ELECTRODE IN THE FIRST WAFER

(71) Applicant: PS4 Luxco S.a.r.l., Luxembourg (LU)

(72) Inventor: Yoshiro Riho, Tokyo (JP)

(73) Assignee: LONGITUDE LICENSING LIMITED, Dublin (IE)

(21) Appl. No.: 14/820,325

(22) Filed: Aug. 6, 2015

Related U.S. Patent Documents

Reissue of:
(64) Patent No.: 8,503,261
Issued: Aug. 6, 2013
Appl. No.: 13/531,346
Filed: Jun. 22, 2012

U.S. Applications:
(63) Continuation of application No. 12/656,485, filed on Feb. 1, 2010, now Pat. No. 8,243,486.

(30) Foreign Application Priority Data

Feb. 5, 2009 (JP) ..... 2009-024486

(51) Int. Cl.
*G11C 7/00* (2006.01)
*G11C 5/06* (2006.01)

(52) U.S. Cl.
CPC ..... *G11C 5/063* (2013.01)

(58) Field of Classification Search
CPC .... G01R 31/318511; G01R 31/318513; G11C 5/02; G11C 5/063; G11C 5/04; H01L 23/60; H01L 27/0296; H01L 2224/13025; H01L 2225/06513; H01L 2225/06517; H01L 2225/06527; H01L 2225/06596; H01L 2224/16145; H01L 2924/13091; H01L 2224/0554; H01L 2924/00014;
(Continued)

(56) References Cited

U.S. PATENT DOCUMENTS 5,504,369 A * 4/1996 Dasse et al. ..... 257/620
6,065,143 A * 5/2000 Yamasaki et al. ..... 714/720
(Continued)

FOREIGN PATENT DOCUMENTS

EP 2302403 A1 * 3/2011 ..... G01R 31/318513
JP 2004-327474 11/2004
(Continued)

*Primary Examiner* — B. James Peikari
(74) *Attorney, Agent, or Firm* — Kunzler Bean & Adamson

(57) ABSTRACT

A method of testing a semiconductor device includes providing a first wafer that includes a first surface, a second surface that is allocated at an opposite side of the first surface, a first electrode penetrating the first wafer from the first surface to the second surface, and a pad formed on the first surface and coupled electrically with the first electrode, providing a second wafer that includes a second electrode penetrating the second wafer, stacking the first wafer onto the second wafer to connect the first electrode with the second electrode such that the second surface of the first wafer faces the second wafer, probing a needle to the pad, and supplying, in such a state that the first wafer is stacked on the second wafer, a test signal to the first electrode to input the test signal into the second wafer via the first electrode and the second electrode.

24 Claims, 12 Drawing Sheets

(58) Field of Classification Search
CPC ..... H01L 2224/05573; H01L 2924/00; H01L 2224/05599; H01L 2224/0555; H01L 2224/0556
USPC ..... 365/201, 51
See application file for complete search history.

(56) References Cited

U.S. PATENT DOCUMENTS

| | | | | |
|---|---|---|---|---|
| 6,839,260 | B2 | 1/2005 | Ishii | |
| 7,123,497 | B2 | 10/2006 | Matsui et al. | |
| 7,126,836 | B2 | 10/2006 | Tanaka | |
| 2006/0262587 | A1 | 11/2006 | Matsui et al. | |
| 2007/0047284 | A1 | 3/2007 | Silvestri | |
| 2007/0153588 | A1 | 7/2007 | Janzen | |
| 2012/0242346 | A1* | 9/2012 | Wang | G01R 31/318513 324/537 |

FOREIGN PATENT DOCUMENTS

| | | | | |
|---|---|---|---|---|
| JP | 2007293982 | | 8/2007 | |
| KR | 20120062281 A | * | 6/2012 | G01R 31/318513 |

* cited by examiner

AMENDED

AMENDED

AMENDED

AMENDED

AMENDED

TESTING CIRCUITS IN STACKED WAFERS USING A CONNECTED ELECTRODE IN THE FIRST WAFER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

The present application is a Continuation Application of U.S. patent application Ser. No. 12/656,485, filed on Feb. 1, 2010 now U.S. Pat. No. 8,243,486, which is based on Japanese patent application No. 2009-024486, filed on Feb. 5, 2009, the entire contents of which is incorporated herein by reference.

BACKGROUND OF THE INVENTION

1. Field of the Invention

This invention relates to a semiconductor device having a DRAM or the like, and particularly to a semiconductor device formed by stacking a plurality of chip dies.

2. Description of the Related Art

An example of this type of semiconductor devices is a semiconductor device in which a memory module is formed by stacking a plurality of DRAM chips on an [IO] *I/O* chip mounted on an interposer board and connecting the DRAM chips to the [IO] *I/O* chip by means of through electrodes formed within through silicon vias (Sivia) (see Japanese [Laid-Open] Patent Publication No. 2004-327474 (Patent Document 1) corresponding to U.S. Pat. No. 7,123,497 (Patent Document 2).

More specifically, according to Patent Document 1, each of the DRAM chips of the memory module has a plurality of vias and through electrodes formed within these vias in order to transfer data signals and data mask signals accompanied by the data signals.

A semiconductor device configured in this manner has advantages that the length of wiring lines connecting a plurality of DRAM chips can be shortened and a DLL, consuming a large amount of current, need be provided only on an [IO] *I/O* chip.

SUMMARY

However, Patent Document 1 gives no consideration to the case in which the transfer speed of a data signal output from a semiconductor device having a plurality of DRAM chips stacked is increased. Specifically, Patent Document 1 does not mention problems which may occur when the data transfer speed from the stacked DRAM chips is increased, nor does *it mention* solutions to such problems. In practice, it has been found that various problems such as increased power consumption and [deteriorated] *decreased* yield would occur when the data transfer speed from the DRAM chips is increased.

Considering, for example, a case where a memory module having a total memory capacity of 2 GB ([giga bytes] *gigabytes*) is formed of 16 DRAM chips, the memory module as a whole will have 64 data I/O through electrodes if each DRAM chip has four data I/O through electrodes. If it is assumed here that a data signal is input and output via each of the data I/O through electrodes at a transfer speed of 1600 Mbps, the data signal will be input and output via the data I/O through electrodes at a transfer speed of 102.4 Gbps (i.e., 12.8 GB/s) in the memory module as a whole.

However, if a data signal is input and output to and from the DRAM chips at a data transfer speed of 1600 Mbps, the current consumed by the DRAM chips will be increased significantly, resulting in increased consumption current and noise in the memory module as a whole. Further, in order to realize a data transfer speed as high as 1600 Mbps, the DRAM chips must be operated at a high frequency of 800 MHz even if the DDR (Double Data Rate) technology is employed. Thus, the fabrication of DRAM chips operating at high frequency will impose difficulties in terms of various product specification values (e.g., timing specification), deteriorating the yield of the product. Furthermore, it will make it difficult to ensure stable operation of the memory module during communication with a memory controller. These problems are attributable to the face that as the number of stacked chips is increased, the high frequency operation (at high data transfer rate) is affected more by total parasitic resistance or total parasitic capacitance of the through silicon vias and via-to-via connections proportional to the thickness of the stacked chips.

The present invention seeks to solve one or more of the above problems, or to improve upon those problems at least in part. In one embodiment, a method of testing a semiconductor device comprising:

providing a first wafer that comprises a first surface, a second surface that is allocated at an opposite side of the first surface, a first electrode penetrating the first wafer from the first surface to the second surface, and a pad formed on the first surface and coupled electrically with the first electrode;

providing a second wafer that comprises a second electrode penetrating the second wafer;

stacking the first wafer onto the second wafer to connect the first electrode with the second electrode such that the second surface of the first wafer faces the second wafer;

probing a needle to the pad; and supplying, in such a state that the first wafer is stacked on the second wafer, a test signal to the first electrode to input the test signal into the second wafer via the first electrode and the second electrode.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
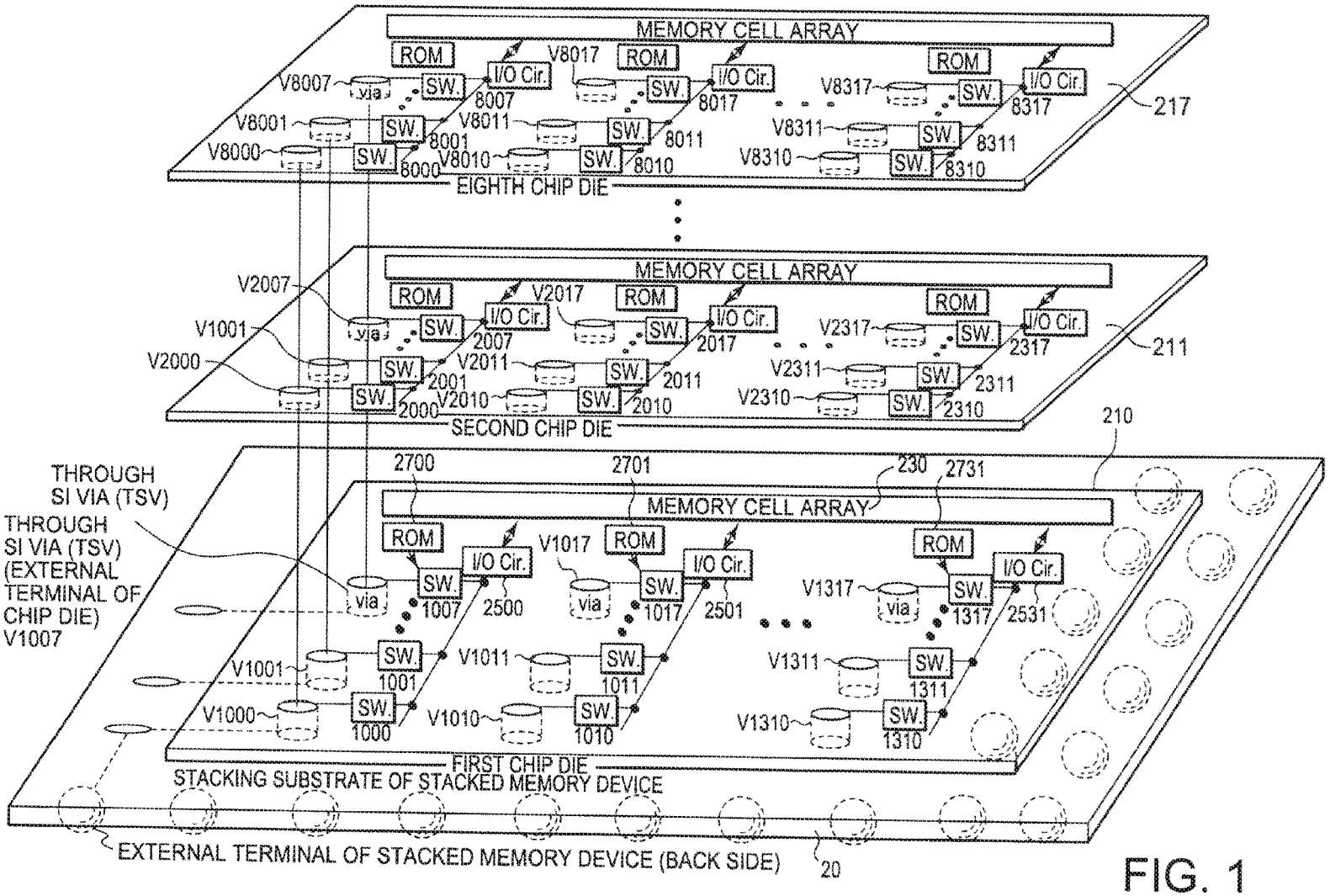
FIG. 1 is a perspective view showing a schematic configuration of a semiconductor device according to a first embodiment of this invention.

Referring to FIG. 1, a semiconductor device according to a first embodiment of this invention will be described.

The shown semiconductor device has a stacking substrate 20 formed for example of an insulating material, and a plurality of chip dies (first to eighth chip dies 210 to 217 in this example) stacked on one surface of the stacking substrate 20, whereby a memory module is formed. Although the following description of this exemplary embodiment will be made on the assumption that the chip dies 210 to 217 have a memory function, the chip dies according to this invention are not limited to those having a memory function. There are provided, on the opposite surface of the stacking substrate 20 to the surface where the chip dies are mounted, BGA (Ball Grid Array) terminals for external data signals, address signals, external control signals, and external clock signals, the BGA terminals being arranged corresponding to the mounting pitch on a packaging substrate (not shown) for mounting the semiconductor device The chip die 210 is generally called as a semiconductor chip by those skilled in the art since it is formed of a semiconductor substrate, particularly of a silicon chip.

An [IO] *I/O* chip such as a controller for controlling the plurality of chip dies may be provided between the chip die 210 and the stacking substrate 20, or, alternatively, the semiconductor device may have only the chip die 210 mounted on the stacking substrate 20. When an [IO] *I/O* chip is stacked together with the chip dies 210 to 217, the [IO] *I/O* chip is provided with a memory controller to form a memory system. On the other hand, when a controller is provided in the outside of the stacking substrate (outside the semiconductor device), a memory system is formed by the semiconductor device including the stacked chip dies and the controller provided outside thereof.

Each of the chip dies 210 to 217 has TSVs (Through-Silicon Vias) to be described later, and the chip dies are mutually connected by a technique using bumps or the like related to the TSV technique. The stacking substrate 20 and the chip dies are also mutually connected by means of bumps or the like.

Each of the chip dies 210 to 217, as shown representatively by the first chip die 210, has a memory array 230, a plurality of [IO] *I/O* circuits (in this example, 32 [IO] *I/O* circuits 2500 to 2531) connected to the memory array 230, and a plurality of switches (in this example, eight switches 1000 to 1007, 1010 to 1017, . . . , 1310 to 1317) connected to input/output lines extending from the [IO] *I/O* circuits 2500 to 2531.

In each of the reference numbers indicating these switches, for example in the reference number "1310", the most significant digit "1" indicates the number of the corresponding chip die, the first chip die in this case, the least significant digit "0" indicates the number allocated to the switch, and the two digits between the most significant and least significant digits "31" represent the last two digits in the number allocated to the corresponding [IO] *I/O* circuit, the [IO] *I/O* circuit 2531 in this case.

Eight switches are connected to each input/output line, and the switches 1000 to 1007, for example, are connected to through electrodes provided within the eight vias V1000 to V1007, respectively. Likewise, eight vias V1010 to V1017 are provided corresponding to the switches 1010 to 1017, respectively. This applies to the other switches as well, and vias V1310 to V1317 are provided corresponding to the switches 1310 to 1317, respectively. Accordingly, there are provided 256 vias in total in the first chip die 210 for the purpose of data transfer. Vias are also provided for a plurality of control signals as described later, in addition to those for the data transfer ([IO] *I/O* signals) but also.

In the example shown in FIG. 1, there are provided ROMs 2700 to 2731 each of which is set to select one of the eight switches connected to each input/output line. These ROMs 2700 to 2731 may be EEPROMs or may be configured as anti-fuses. The same applies to other ROMs to be described later. Although, in this embodiment, the ROMs 2700 to 2731 are provided respectively corresponding to the [IO] *I/O* circuits 2500 to 2531 in a one-to-one relationship, a single ROM may be provided to cover all the switches 1000 to 1317 connected to the [IO] *I/O* circuits 2500 to 2531.

Second to eighth chip dies 211 to 217 have the same configuration as that of the first chip die 210, and have switches 2000 to 2317, . . . , and 8000 to 8317, respectively. More specifically, like the first chip die 210, the second chip die 211 is provided with 256 (32×8) data transfer vias V2000 to V2317 and data transfer through electrodes in correspondence with the switches 2000 to 2317. The eighth chip die 217 is also provided with 256 data transfer vias V8000 to V8317 in correspondence with the switches 8000 to 8317.

As mentioned above, the first to eighth chip dies 210 to 217 have the same configuration and thus these chip dies can be manufactured using the same design, the same pattern layout, and the same manufacturing process.

Further, in the example shown in FIG. 1, only one of the eight switches connected to each input/output line is rendered electrically conductive by the ROMs 2700 to 2731. In the first chip die 210, one of each set of the switches 1000 to 1007, 1010 to 1017, . . . , and 1310 to 1317 respectively connected to the [IO] *I/O* circuits 2500 to 253 is selected to be rendered conductive by the ROMs 2700 to 2731. Therefore, in this first chip die 210, 32 switches are rendered electrically conductive at the same time. This means that 32-bit data signals are simultaneously input and output to and from the first chip die 210.

In the second to eighth chip dies 211 to 217 as well, like the first chip die 210, 32 switches are simultaneously rendered conductive by the ROMs, whereas the positions of the 32 switches rendered conductive are different among the chip dies 210 to 217. For example, the switches 1000, 1010, . . . , and 1310 are made conductive in the first chip die 210, and the switches 2001, 2011, . . . , and 2311 are made conductive in the second chip die 211. The same rule is applied to the other chip dies, and the switches 8007, 8017, . . . , and 8317 are made conductive in the eighth chip die 217.

As a result, in the first chip die 210, data signals of 32-bit width are transmitted and received via the switches 1000, 1010, . . . , and 1310 and the data transfer vias V1000, V1010, . . . , and V1310 corresponding to these switches. Likewise in the second chip die 211, data signals are transmitted and received via the switches 2001, 2011, . . . , and 2311 and the data transfer vias V2001, V2011, . . . , and V2311 corresponding to these switches. In the eighth chip die 217, data signals are transmitted and received via the switches 8007, 8017, . . . , and 8317 and the data signal transfer vias V8007, V8017, . . . , and V8317 corresponding thereto.

The data signal transfer vias provided in the first to eighth chip dies 210 to 217 and connected to the non-conductive switches do not assume any role in the chip dies but only allow data signals from other chip dies to pass through.

Consequently, in the memory module as a whole, data signals (×256-bit data signals) are input and output through the data transfer through electrodes formed in 256 vias.

The shown memory module is thus characterized by having a number of vias (e.g., 256 vias) corresponding to the number of stacked chip dies and the number of bits of data signals input and output to and from an external circuit (e.g., a memory controller). As mentioned in the above, the data transfer through electrodes formed in the vias function as a single data line no matter how many chip dies are stacked. Although eight chip dies are stacked in this example, the number of stacked chip dies is not limited to eight. When 16 chip dies are stacked, for example, 16 switches and 16 through electrodes corresponding thereto are provided and the switches are controlled in the same manner as described above.

It is assumed here that the data transfer speed of the shown memory module is 12.8 Gbytes/sec (102.4 Gbits), and the memory module has a memory capacity of 2 Gbytes (16 Gbits).

In the memory module shown in FIG. 1 having eight chip dies, as described above, data signals are transmitted and received through the 256 data transfer through electrodes formed in the 256 vias. In this case, each data transfer through electrode only need be capable of transmitting and receiving data signals at a data transfer rate of 400 Mbps (102.4 Gbit/256). Thus, the data transfer rate of data signals transmitted and received through each data transfer through electrode of the chip dies 210 to 217 can be reduced in comparison with the transfer rate according to the conventional technique by increasing the number of vias the chip dies 210 to 217 according to the number of stacked chip dies. This enables the memory module to stably communicate with the memory controller at a low power consumption, and provides a memory module having a data transfer speed of 12.8 Gbytes/sec.

On the other hand, the memory controller has a parallel-serial conversion circuit (not shown). For example, during read data communication from the memory chip dies, the parallel-serial conversion circuit converts data transmitted by the chip dies at 400 Mbps into 1600-Mbps serial data signals and provides the same to a CPU or the like. Further, the memory controller also has a serial-parallel conversion circuit for converting 1600-Mbps serial data signals from the CPU or the like into 400-Mbps parallel data and transmitting the same to the chip dies.

According to the configuration as described above, the chip dies 210 to 217 can be operated at a lower speed compared to the conventional technique, and thus the consumption current can be reduced compared to the conventional chip dies operating at a higher speed. The configuration thus realizes stable communication and improves the manufacturing yield.

When the chip dies 210 to 217 are stacked on an [IO] *I/O* chip having a controller (in other words, when at least a plurality of memory chips and a memory controller chip controlling the same are packaged together as a semiconductor device molded using a resin material), the [IO] *I/O* chip is provided with the same number of vias as the vias provided in the chip dies 210 to 217, and the data transfer through electrodes formed in these vias on the [IO] *I/O* chip are connected to the data transfer through electrodes of the chip dies to transmit and receive data signals to and from the controller. The controller has a parallel-serial conversion circuit for parallel-serial converting data signals received from the chip dies 210 to 217 through the 256 data transfer through electrodes, and a serial-parallel conversion circuit for serial-parallel converting data signals from the outside.

In contrast, when no [IO] *I/O* chip is provided (in other words, when a plurality of memory chips are packaged as a semiconductor device molded with a resin material while a memory controller controlling the same is provided as a separate semiconductor device by being packaged separately), the data transfer speed of data signals given through the BGA terminals of the stacking substrate 20 is converted by the controller arranged outside thereof.

Figure 2:
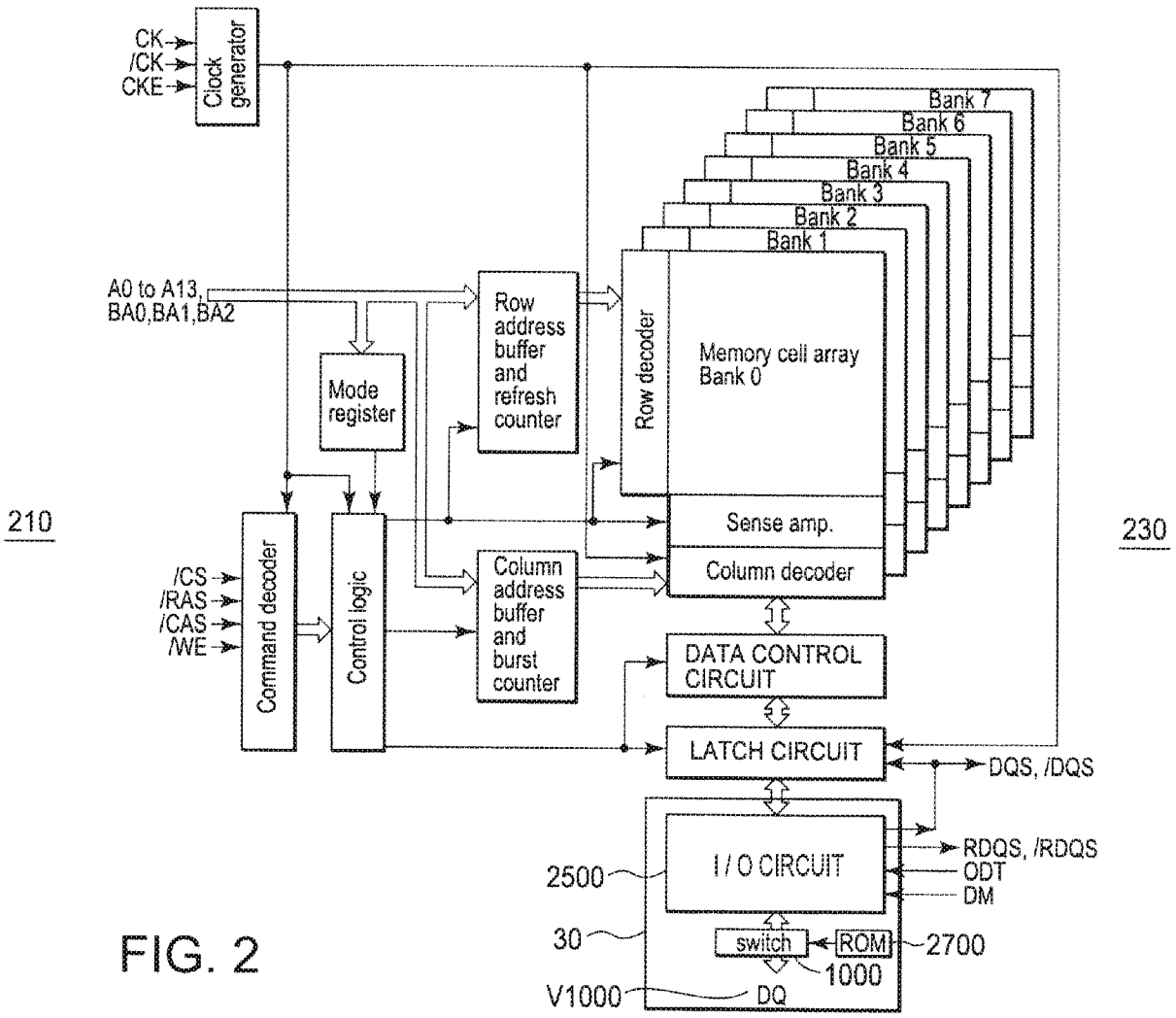
FIG. 2 is a diagram showing an electrical circuit configuration of the semiconductor device shown in FIG. 1.

Referring to FIG. 2, an electrical circuit configuration of the chip dies (herein, description will be made taking the chip die 210 as an example). The chip die 210 shown in FIG. 2 has a memory cell array 230, and an interface circuit 30 in which the switches 1000 to 1317, [IO] *I/O* circuits 2700 to 2731, input/output lines, and through electrodes formed in the vias V1000 to V1317 as shown in FIG. 1 are integrated. Although the interface circuit 30 actually includes the [IO] *I/O* circuits 2500 to 2531, the switches 1000 to 1317, the ROMs 2700 to 2731, and the through electrodes (V1000 to V1317 (DQ)), only the [IO] *I/O* circuit 2500, the switch 1000, the ROM 2700, and the through electrode (DQ) 1000 formed in the via V1000 are shown in the illustrated example for the sake of simplification.

The shown memory cell array 230 has banks 0 to 7, and sense amplifiers, column decoders, and row decoders connected to the respective banks 0 to 7. The memory cell array 230 is further provided with a row address buffer and refresh counter and a column address buffer and burst counter for receiving address signals A0 to A13 and bank addresses BA0 to BA2 supplied from the outside, and with a mode register.

Further, a command decoder and a control logic circuit are provided for receiving command signals /CS, /RAS, /CAS, and /WE supplied from the outside. The command decoder and the control logic circuit are supplied with clock signals from a clock generator.

The shown chip die 210 has the interface circuit 30, as described above, arranged between the memory cell array 230 and the data transfer through electrodes (DQ). This interface circuit 30 is connected to the column decoders via a latch circuit and a data control circuit. The latch circuit and the data control circuit are controlled by the control logic circuit. The clock signals from the clock generator are also supplied to the column decoder and the latch circuit.

The shown interface circuit 30 has all of the [IO] *I/O* circuits, ROMs, switches, and data transfer through electrodes shown in FIG. 1. The interface circuit 30 is further provided with terminals for on-die termination signals (ODT) and data mask signals (DM), a terminal for data strobe signals (DQS,/DQS), and a terminal for RDQS,/RDQS.

The components of the memory cell array 230, such as the banks 0 to 7, the column decoders, and the row decoders may be those used in conventional DRAMs. Accordingly, description thereof will be omitted here.

Although only the chip die 210 is illustrated in FIG. 2, the other chip dies 211 to 217 also have the same configuration as the chip die 210.

Figure 3A:
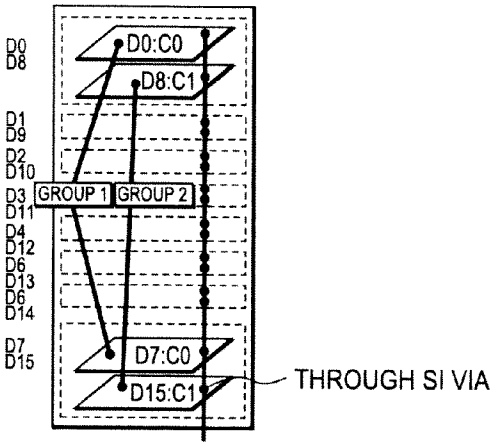
FIGS. 3A and 3B are diagrams for explaining a concept of a semiconductor device according to a second embodiment of the invention.
Figure 3B:
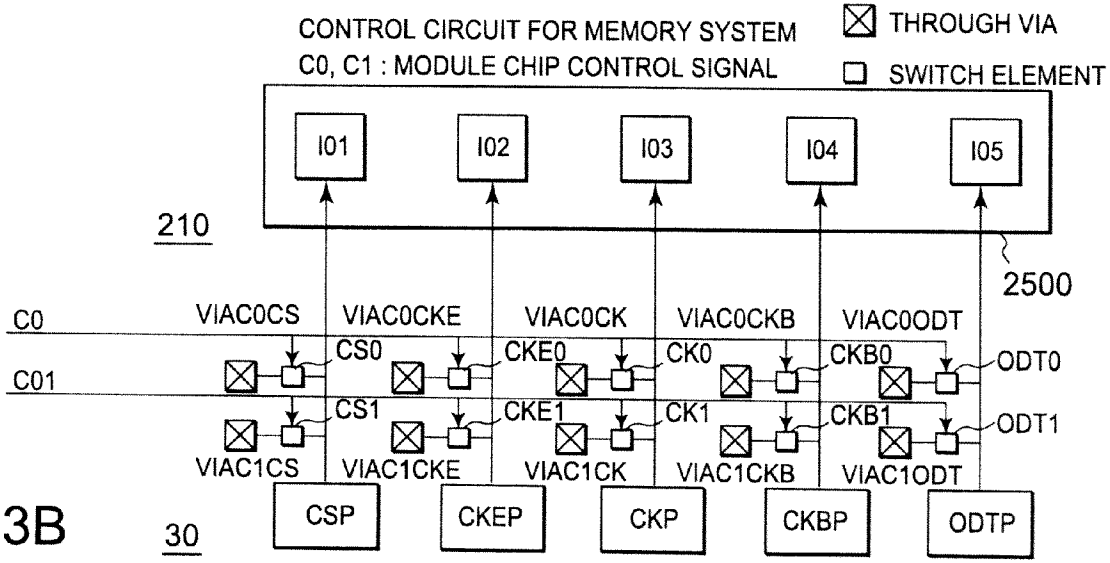

Referring to FIGS. 3A and 3B, a semiconductor device according to a second embodiment of this invention will be described. The semiconductor device shown in FIG. 3A is a memory module including first to sixteenth chip dies D0 to D15. Each of the chip dies D0 to D15 has 256 data transfer through electrodes (i.e., DQ pins), in the same manner as the semiconductor device according to the first embodiment shown in FIG. 1 in this respect. Accordingly, like the one in the first embodiment, this memory device is also capable of transferring data at a low speed from the chip dies D0 to D15 through the 256 data transfer through electrodes, and the power consumption of the memory module can be reduced.

However, the memory module according to the second embodiment shown in FIG. 3A is different from the memory module of the first embodiment in the fact that the number of chip dies is doubled compared to the first embodiment and sixteen chip dies D0 to D15 are provided.

Describing more specifically, in the memory module shown in FIG. 3A, the first to sixteenth chip dies D0 to D15 are divided into first and second groups, so that the first and second groups are switched over by using system control signals C0 and C1. Specifically, the first group is composed of the first to seventh chip dies D0 to D7, and the second group is composed of the eighth to sixteenth chip dies D8 to D15.

Further, according to the second embodiment, the system control signals (i.e., group select signals) C0 and C1 for selecting the first and second groups are also used for selection of a chip select signal CS, a clock enable signal CKE, and clock signals CK and ICK. The chip select signal CS, clock enable signal CKE, and the clock signals CK and /CK are divided by the first and second groups, whereby the chip dies belonging to either the first or second group can be selectively operated.

When the chip dies D0 to D15 each have a 1-Gbit memory cell array, a memory module having 16 chip dies with a memory capacity of 2 GB in total and capable of inputting and outputting data signals having 256-bit width.

In this embodiment, each of the chip dies D0 to D15 is provided with 349 through electrodes in total, including 256 through electrodes (DQ000 to DQ031, DQ100 to 131, . . . , and DQ700 to DQ731) for transferring data signals (DQ), 32 DM through electrodes (DM00 to DM03, DM10 to DM13, . . . , and DM70 to DM73), 32 through electrodes for data strobe signals (DQS00 to DQS03, DQS10 to DQS13, . . . , and DQS70 to DQS73), 14 through electrodes for addresses (A0 to A13), two through electrodes for bank addresses (BA0 and BA1), three through electrodes for command signals (/RAS,/CAS,/WE), and ten through electrodes for control signals (CS0, CS1, CKE0, CKE1, CK0, CK1, /CK0, /CK1, ODT0, and ODT1). It should be noted that other through electrodes not related to this invention (such as power-supply through electrodes) are not disclosed here.

As is evident from the description above, the first group chip dies D0 to D7 and the second group chip dies D8 to D15 use in common the through electrodes for transferring data signals, the DM through electrodes, the through electrodes for data strobe signals, the through electrodes for bank addresses, the through electrodes for command signals, and the through electrodes for control signals.

Therefore, in the shown embodiment, it is necessary to identify, based on a control signal supplied to the through electrodes for control signals, which of the first and second group is using the through electrodes for transferring data signals, the DM through electrodes, the through electrodes for data strobe signals, the through electrodes for bank addresses, the through electrodes for command signals, and the through electrodes for control signals.

FIG. 3B shows a circuit provided on each of the chip dies (e.g., the chip die 210) for selecting the chip select signal CS, the clock enable signal CKE, the clock signal CK, /CK (CKB), and the on-die termination signal (ODT), in response to the system control signals C0 and C1. The shown circuit is provided in the interface circuit 30 on each chip die (e.g., the chip die 210), and has a chip select pad CSP, a clock enable pad CKEP, clock pads CKP and CKBP, and an ODT pad ODTP. Signals from these pads are supplied to respective corresponding input circuits IO1 to IO5 of the [IO] *I/O* circuit (e.g., [IO] *I/O* circuit 2500).

In order to select various signals according to the chip die groups, there are provided switches and vias which are rendered electrically conductive by the system control signals C0 and C1. Specifically, there are provided a chip select switch CS0, a clock enable switch CKE0, clock switches CK0 and CKB0, and an ODT switch ODT0 which are rendered conductive in response to the system control signal C0, and these switches are connected to through electrodes in the vias VIAC0CS, VIAC0CKE, VIAC0CK, VIAC0CKB, and VIAC0ODT.

On the other hand, there are provided a chip select switch CS1, a clock enable switch CKE1, clock switches CK1 and CKB1, and an ODT switch ODT1 which are rendered conductive in response to the system control signal C1, and these switches are connected to through electrodes in the vias VIAC1CS, VIAC1CKE, VIAC1CK, VIAC1CKB, and VIAC1ODT.

In the example shown in FIGS. 3A and 3B, when the shown chip die (210) belongs to the group to be controlled by the system control signal C0, the chip select switch CS0, the clock enable switch CKE0, the clock switches CK0 and CKB0, and the ODT switch ODT0 are made conductive are electrically conductive, whereby the signals received through the pads are supplied not only to the input circuit of the chip die (210), but also to the other chip dies of the same group through the through electrodes formed in the vias VIAC0CS, VIAC0CKE, VIAC0CK, VIAC0CKB, and VIAC0ODT.

When the chip die belongs to the group to be controlled by the system control signal C1, various control signals as described above are supplied to the other chip dies of the same group by way of the switches CS1, CKE1, CK1, CKB1, and ODT1, through the through electrode formed in the vias VIAC1CS, VIAC1CKE, VIAC1CK, VIAC1CKB, and VIAC1ODT.

In this manner, not only the data signals but also various control signals can be distributed to the respective groups by using the system control signals C0 and C1.

Figure 4:
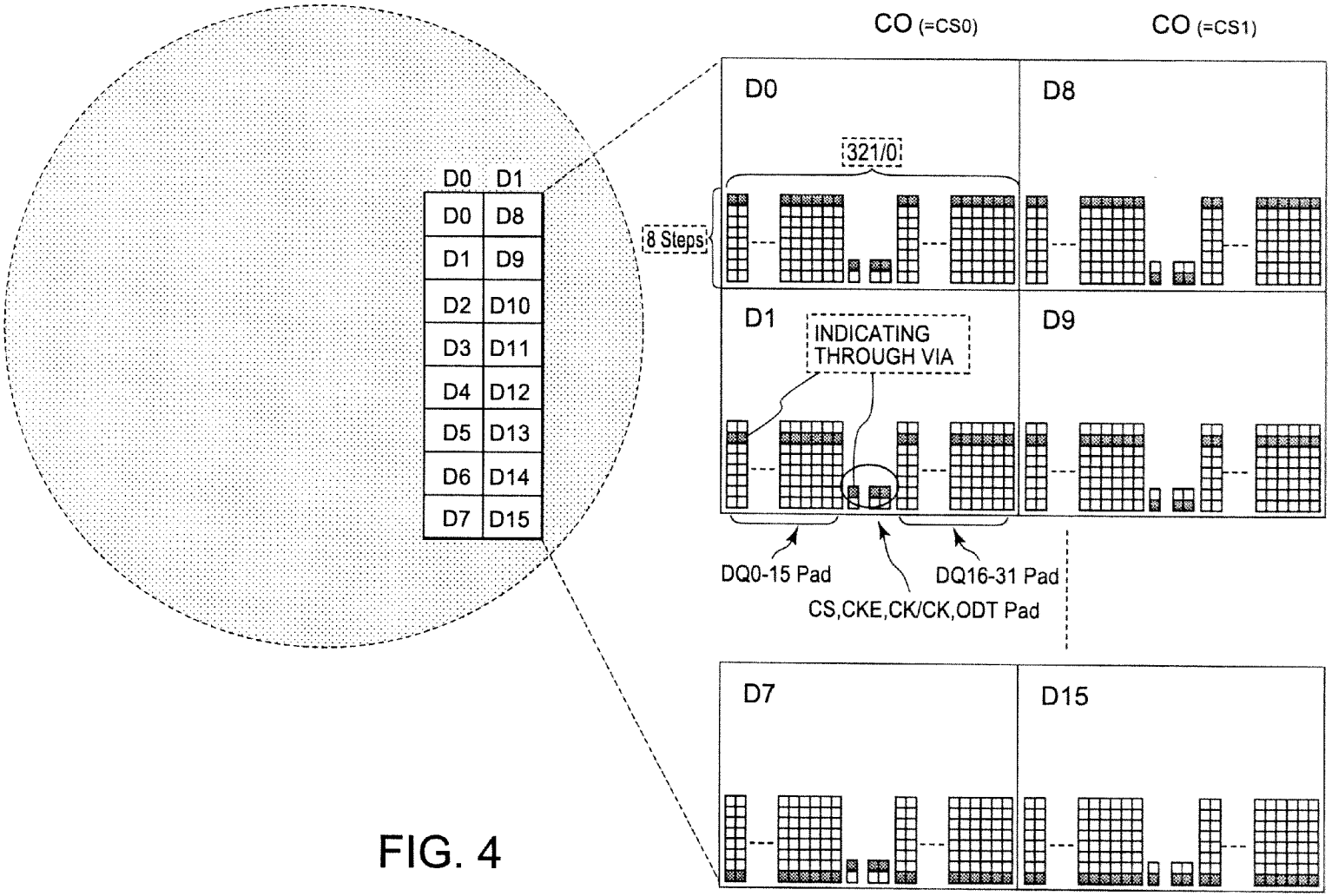
FIG. 4 is a diagram for explaining a via configuration and an arrangement of through electrodes of chip dies used in the semiconductor device shown in FIGS. 3A and 3B.

FIG. 4 shows an arrangement of the chip dies and vias in the semiconductor device according to the second embodiment shown in FIGS. 3A and 3B. As shown in the left side of FIG. 4, the first to sixteenth chip dies D0 to D15 shown in FIG. 3A are fabricated and arranged on a wafer. In the example shown in FIG. 4, the first to seventh chip dies D0 to D7 belonging to the first group and to be controlled by the system control signal C0 are laid out in a vertical line on the wafer, and the eighth to sixteenth chip dies D8 to D15 belonging to the second group and to be controlled by the system control signal C1 are arranged in a line adjacent to the line of the first to eighth chip dies D0 to D7.

For the sake of simplification, description here will be on the assumption that all of the first to sixteenth chip dies D0 to D15 are non-defective. However, if any of the chip dies are defective, chip dies located in other regions on the wafer may be used.

In the right side of FIG. 4, regions in the first to sixteenth chip dies D0 to D15 where the vias (TSV) are arranged are shown in enlargement. In each of the chip dies D0 to D15, through electrodes (DQ) are provided by the data signal transfer vias in a number of rows corresponding to the number of stacked chip dies (here, eight rows in a vertical direction). More specifically, in each of the first to sixteenth chip dies D0 to D15, 32 vias DQ0-15 and DQ16-31 corresponding to the data transfer through electrodes DQ to be used by the chip die are arranged in a row in a transverse (X) direction (represented by shades of gray), while the data transfer through electrodes DQ0-15 and DQ16-31 to be used by the other chip dies are provided in a number of rows corresponding to the number of the other stacked chip dies.

Further, between the data transfer through electrodes DQ0-15 and the data transfer through electrodes DQ16-31, six via sets (represented by shades of gray) for system signals (CS, CKE, CK, /CK, ODT) serving as control signals controlling operation of the semiconductor chip are provided in two rows, the number of rows being corresponding to the number of the groups. These two rows of the system signal vias (TSV) are allocated to the groups, respectively. In the example shown here, the system signal via sets in the upper row represented by shades of gray are allocated to the first group controlled by the system signal C0, while the via set in the lower row are allocated to the second group controlled by the system signal C1.

As is seen from FIG. 4, 32 data transfer vias arranged transversely in the first row (the uppermost row) represented by shades of gray are allocated to the first chip die D0, and 32 data transfer vias arranged transversely in the second row are allocated to the second chip die D1. Likewise, 32 data transfer vias in the eighth row are allocated to the eighth chip die D7.

To the eighth chip die D8, the ninth chip die D9, . . . and the sixteenth chip die D15 forming the second group as well, 32 data transfer vias in the first, the second, . . . , and the eighth rows are allocated, respectively.

Figure 5:
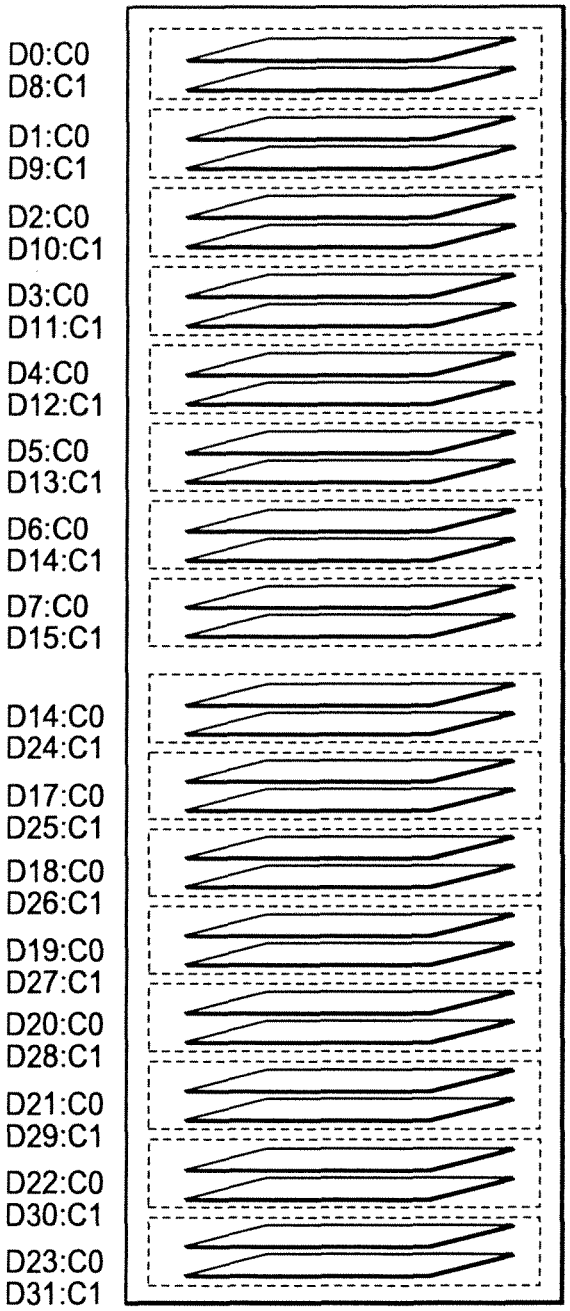
FIG. 5 is a diagram showing a semiconductor device according to a third embodiment of the invention which is configured using the chip dies shown in FIG. 4.

FIG. 5 shows a semiconductor device according to a third embodiment of this invention. The shown semiconductor device is a memory module formed by using the 32 chip dies as shown in FIG. 4. The memory module is formed of the first to thirty-first chip dies D0 to D31, and each of the chip dies D0 to D31 has 1-Gbit memory capacity and includes 256 data transfer through electrodes DQ0 to DQ31. This memory module as a whole has 4-Gbyte (32-Gbit) memory capacity.

As shown in FIG. 5, the first to eighth chip dies D0 to D7 form a first group controlled by a system control signal C0, while the ninth to sixteenth chip dies D8 to D15 from a second group controlled by a system control signal C1. Likewise, the 17th to 24th chip dies D16 to D23 shown in the lower part of FIG. 5 form the first group controlled by the system control signal C0, while the 25th to 32nd chip dies D24 to D31 from the second group controlled by the system control signal C1.

According to this configuration, like the second embodiment shown in FIG. 3, the first and second groups are selectively switched over by the system control signals C0 and C1. Compared to the embodiment shown in FIG. 3, the number of chip dies is doubled (32 chip dies), whereby 16 data transfer through electrodes DQ among 256 of them are used in each of the chip dies. Accordingly, ×16-bit data signals are input and output from each chip die.

In order to form the memory module shown in FIG. 5, the chip dies inputting and outputting ×32-bit data signals must be changed over to input and output ×16-bit data signals DQ.

Figure 6:
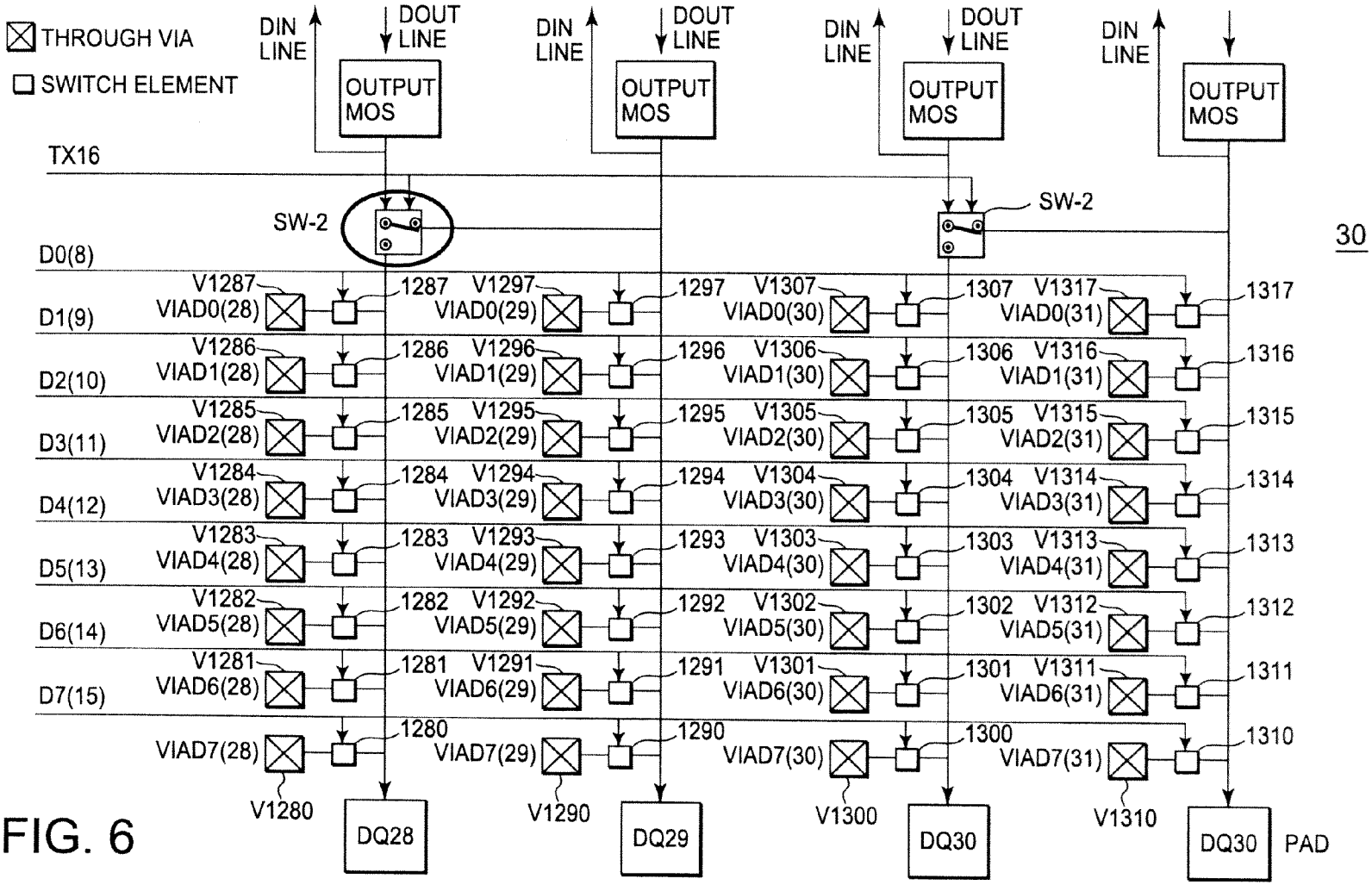
FIG. 6 is a diagram showing a specific configuration of the chip dies used in the configuration shown in FIG. 5.

FIG. 6 shows a part of an interface circuit 30 for converting ×32-bit data signals into ×16-bit data signals. The shown interface circuit 30 is mounted on each of the chip dies. The first to eighth chip dies D0 to 07 have the same configuration as that of the ninth to sixteenth chip dies D8 to D15. Thus, the figures in the parenthesis indicate an input/output line allocated to the ninth to sixteenth chip dies D8 to D15 and a data signal of the ninth to sixteenth chip dies D8 to D15.

In the example shown in FIG. 6, chip die select lines indicated as D0(8) to D7(15) to be selected by the ROM 2700 or the like shown in FIG. 1 (here, referred to as the first ROM), and in the same manner as in FIG. 1, the chip die select lines are connected to switches 1280 to 1287, 1290 to 1297, 1300 to 1307, and 1310 to 1317, while the switches 1280 to 1317 (here, referred to as the first switches) are connected to vias V1280 to V1317, respectively.

The shown interface circuit 30 of the chip die includes data signal pads DQ28 to DQ31, data input/output lines DIN and DOUT and output MOS transistors respectively connected to the data signal pads (DQ28 to DQ31).

Further, a second switch SW-2 controlled by a control signal TX16 is provided in alternate one of the data input/output lines (in the shown example, the data input/output lines connected to the data signal pads (DQ28 and DQ30). The second switches SW-2 are rendered electrically conductive or non-conductive by the control signal TX16. When non-conductive, the second switches SW-2 prohibit the input and output to and from the data signal pads DQ28 and DQ30 while allowing the input and output to and from the data signal pads DQ29 and DQ31. For example, data from the output MOS of DQ28 is output to the data signal pad DQ29. When conductive, data from the output MOS of DQ28 is output to the data signal pad DQ28. The same applies to inputting data. It should be noted that, during this operation, the intrinsic output MOS circuit of the data signal pad DQ29 is not used according to control not shown here.

As is seen from the example shown in FIG. 6, the second switches SW-2 are rendered non-conductive by the control signal TX16 when ×16-bit data signals are to be input or output. As a result, ×32-bit chip dies are changed into chip dies inputting and outputting ×16-bit data.

Thus, in the shown example, the control signal TX16 controls such that ×32 data from the 32 output MOS circuits are output from 16 output MOS circuits. Thus, the control signal TX16 serves as a signal for compression-controlling the data, and hence the control signal TX16 will be herein referred to as the data compression-controlling signal.

A data compression-controlling signal for changing ×32-bit chip dies to chip dies for inputting and outputting ×16-bit data is generated by setting the state of a second ROM (different from the ROM 2700 for controlling the first switches) for controlling the second switches individually for each of the chip dies. In the chip die D0, for example, the second ROM is set to render the switches SW-2 electrically non-conductive so that the data from the output MOS of DQ28 is output to the data signal pad DQ29. On the other hand, in the chip die D1, the second ROM is set to render the switches SW-2 conductive, so that the data from the output MOS of DQ28 is output to the data signal pad DQ28. When the chip dies are stacked, the second switches SW-2 provided in the interface circuits 30 of the chip dies are connected to the external terminals of the stacking substrate through the vias (TSV).

Figure 7A:
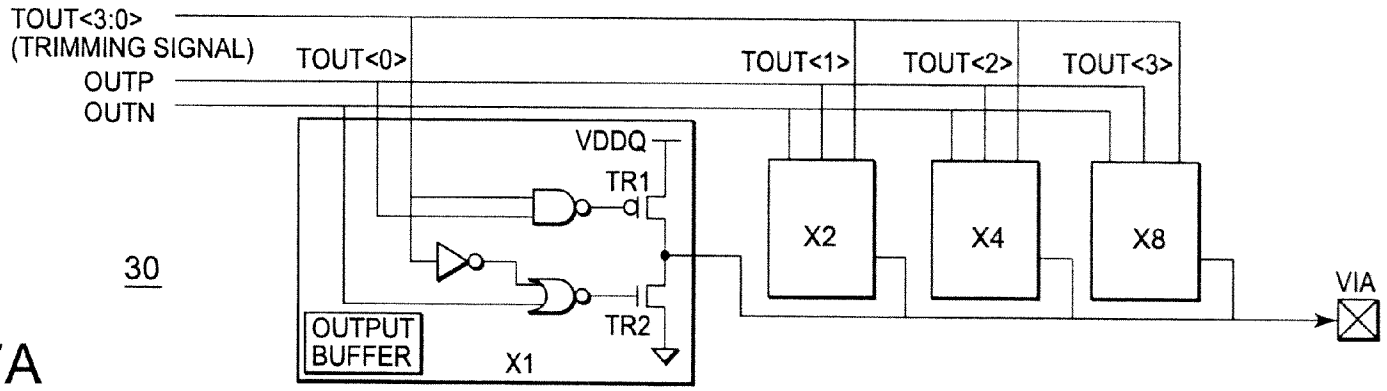
FIGS. 7A and 7B are diagrams showing, respectively, a circuit used in a semiconductor device according to a fourth embodiment of the invention and an example of a memory module provided by the semiconductor device according to the fourth embodiment.
Figure 7B:
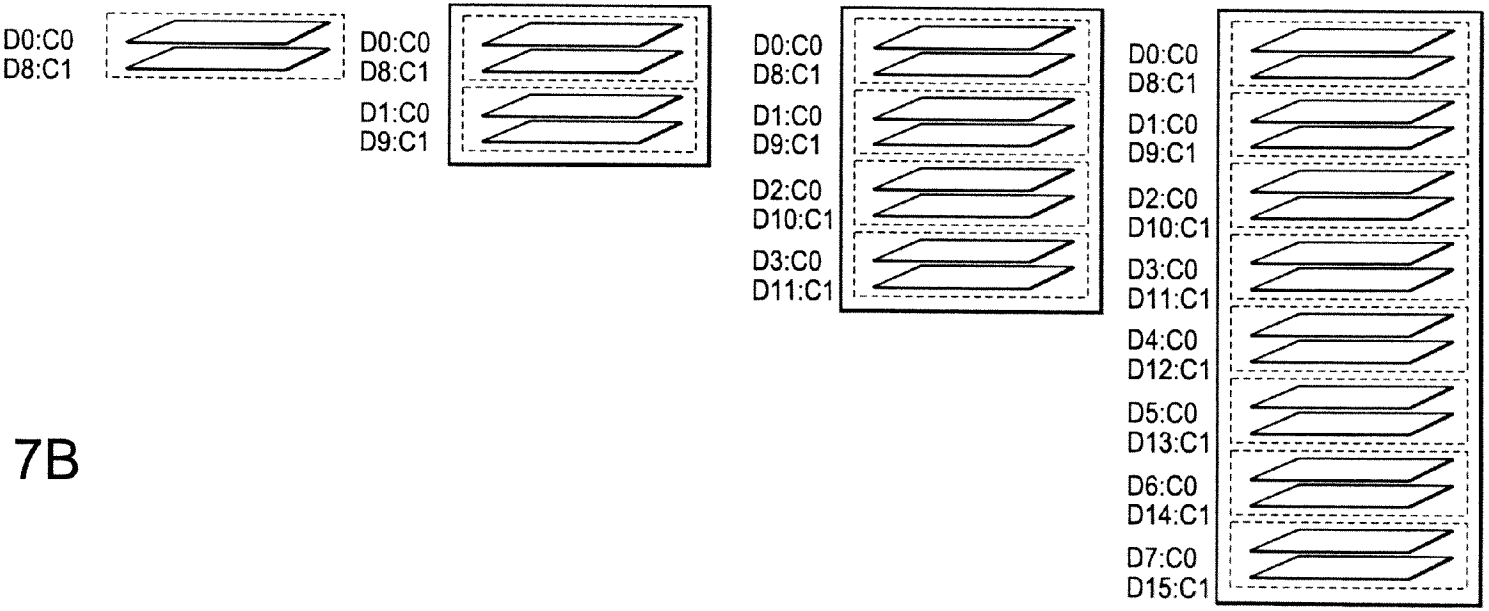

Referring to FIGS. 7A and 7B, description will be made of a semiconductor device according to a fourth embodiment of this invention. The semiconductor devices shown in FIG. 7B are memory modules using the same chip dies as those shown in FIG. 4. According to the fourth embodiment, several different types of products can be obtained by changing the number of the chip dies stacked.

In the example shown in FIG. 7B, there are obtained a first memory module composed of two chip dies D0 and 08, a second memory module composed of four chip dies D0, D8, D1, and D9, a third memory module composed of eight chip dies D0, D8, D1, D9, D2, D10, D3, and D11, and a fourth memory module composed of 16 chip dies D0, D8, D1, D9, D2, D10, D3, D11, D4, D12, D5, D13, D6, D14, D7, and D15. In the shown example, the chip dies are divided into first and second groups by system control signals C0 and C1.

The first to fourth memory modules have 2-Gbit, 4-Gbit, 8-Gbit, and 16-Gbit memory capacities, respectively. When the memory modules have mutually different numbers of stacked chip dies as in the first to fourth memory modules, it is necessary to take into consideration that the parasitic capacitance and parasitic resistance of data transfer through electrodes formed in the vias (which depend on the thicknesses of the chip dies themselves (i.e., the thickness of the silicon substrates)) and the parasitic capacitance and parasitic resistance caused by bumps connecting between the chip dies (between the through electrodes) differ from one another, and hence the time constants defined by the total parasitic capacitance and total parasitic resistance also differ from one another. In the fourth embodiment, a configuration is provided to optimize the output drive capacity of output buffers according to the number of stacked chip dies, and preferably according to the number of stacked chip dies and the number of groups, and a third ROM is further provided to control the drive capacity. This third ROM may be provided either in the inside of the semiconductor device (e.g. in the [IO] *I/O* chip) forming a memory module, or in the outside of the semiconductor device.

FIG. 7A shows a circuit configuration for optimizing the output drive capacity of output buffers provided in the interface circuit 30, according to a change in the time constant caused by parasitic capacitance and parasitic resistance. In the example shown here, there are provided four output buffers X1, X2, X4, and X8 having mutually different drive capacities (the numerical values following the letter "X" indicate capacity ratios). Each of the output buffers X1 to X4 are formed by an inverter, and NAND, NOR, and CMOS transistors. They have the same circuit configuration, but their transistors are of mutually different sizes.

Each of the output buffers X1 to X8 is supplied with output signals OUTP and OUTN having different polarities as data signals to be output, and is also supplied with a trimming signal TOUT from a third ROM (not shown). According to this configuration, the first memory module for example is set such that only the output buffer circuit X1 is caused to assume the operating by the trimming signal TOUT, whereas the second memory module is set such that the output buffer circuits X1 and X2, for example, are caused to assume the operating state by the trimming signal TOUT. Likewise, the third memory module is configured such that the output buffer circuits X1 and X4 are r caused to assume the operating state by the trimming signal, and the fourth memory module is configured such that the output buffer circuits X1 and X8 are caused to assume the operating state. In this manner, in order to drive the signal lines connected to the [IO] *I/O* circuit 2500, a plurality of output buffers are provided in the circuit 2500, and the number of output buffers to be activated can be controlled according to the number of stacked chip dies, that is, the number of chip dies or the number of groups. This means that the trimming signals TOUT generated by the third ROM are useful as control signals for controlling the number of output buffers to be activated in the semiconductor device according to this invention.

The configuration described above provides an advantage that memory modules having various different memory capacities can be fabricated using a single type of chip dies (by using the same design, the same pattern layout, and the same manufacturing process).

Further, when four different types of memory modules as shown in FIG. 7B are selectively formed according to the fourth embodiment, it is desirable not only to select the output buffer circuits X1 to X4 but also to change the output supply voltage. Firstly, since the data transfer speed from the chip dies can be reduced to about 200 MHz compared to 800 MHz of conventional products, optimum operation can be realized at a lower voltage than the normal supply voltage VDD (1.8V). Secondly, optimum operation can be realized at a lower voltage than the normal supply voltage VDD (1.8V) according to a time constant defined by total parasitic capacitance and total parasitic resistance which are variable according to the number of stacked chip dies, preferably according to the number of stacked chip dies and the number of groups.

In fact, various different types of products formed by stacking the chip dies (stacked memory devices) have different operating frequencies and internal time constants from one another, and have different drive voltages corresponding to their optimum drive capacities. Accordingly, the aforementioned embodiment discloses a circuit configuration optimizing the output drive voltage of the output buffers by means of the third ROM.

Figure 8:
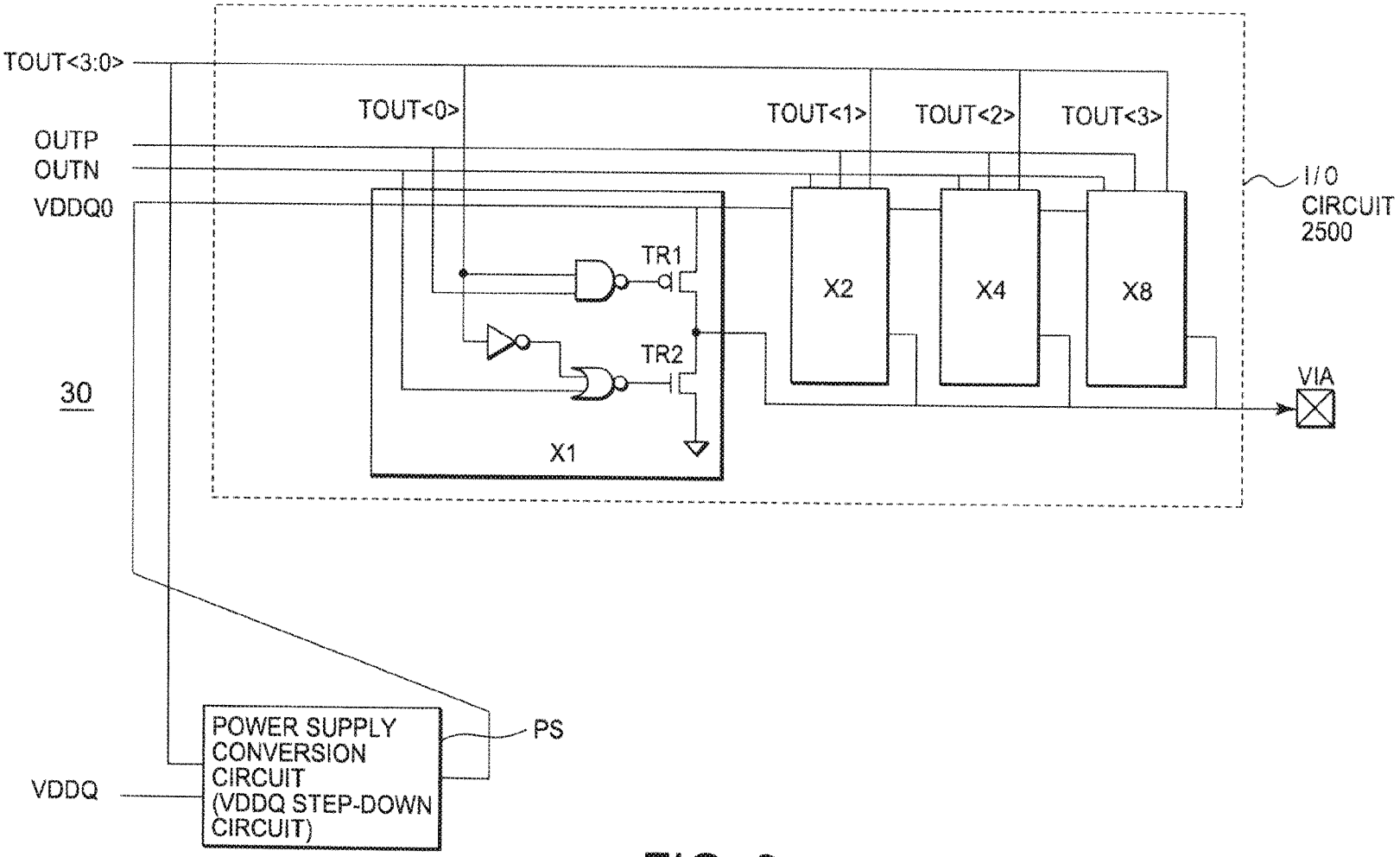
FIG. 8 is a diagram showing a power supply circuit used in the embodiment shown in FIGS. 7A and 7B.

FIG. 8 shows a supply voltage conversion circuit PS which uses the trimming signal TOUT shown in FIG. 7A to supply a supply voltage appropriate for the memory module to an output transistor (TR1) within the [IO] *I/O* circuit 2500. The supply voltage conversion circuit PS supplies four supply voltages VDDQ0 (1.8V, 1.5V, 1.2V, and 0.9V) appropriate for the first to fourth memory modules (for the types of stacked memory devices) shown in FIG. 7(B), from a power supply VDDQ given, exclusively for the output transistors, to the through electrodes (TSV) corresponding to the terminals (BGA) of the stacked memory devices or the supply terminals of the chip dies. The supply voltage conversion circuit PS is provided in the interface circuit 30.

The level of the power supply pf a preceding logic element controlling the output transistor (TR1) may be shifted, if necessary, to the level of the supply voltage VDDQ0 obtained by being converted from the power supply VDDQ.

Figure 9:
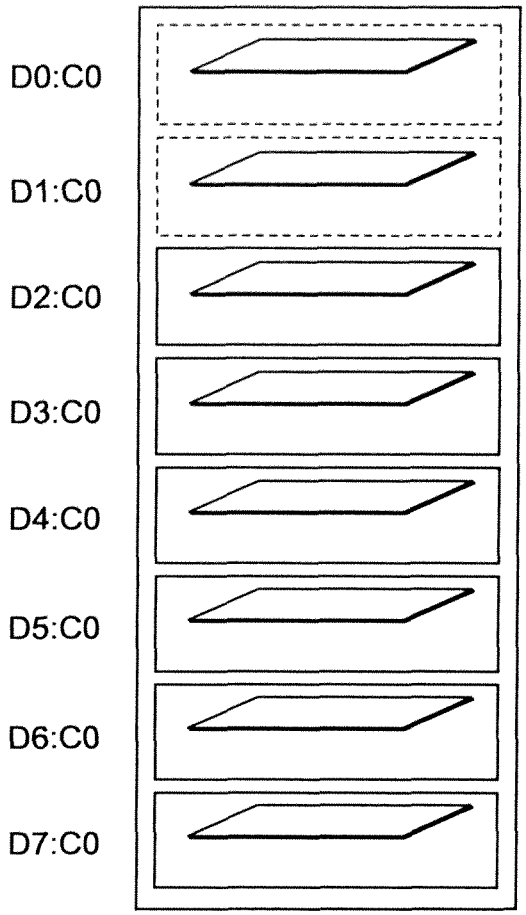
FIG. 9 is a diagram showing a semiconductor device according to a fifth embodiment of the invention.

FIG. 9 shows a semiconductor device according to a fifth embodiment of this invention. Whereas the embodiments described so far have a configuration in which a plurality of chip dies are divided into two groups and system control signals are used to select these groups, the fifth embodiment is applicable to a configuration in which chip dies are not divided into groups. The semiconductor device shown in FIG. 9 is an example of a memory module having a configuration in which first to eighth chip dies D0 to D7 are controlled by a single system control signal C0.

Each of the shown chip dies D0 to D7 has, as shown in FIG. 4, 1-Gbyte memory capacity and 256 data transfer through electrodes (DQ). Thus, even this configuration using a single system control signal C0 to control the chip dies can output ×32-bit wide data signals DQ from the chip dies D0 to D7 at a data transfer speed of about 200 MHz, and hence can reduce the power consumption of the chip dies.

Figure 10:
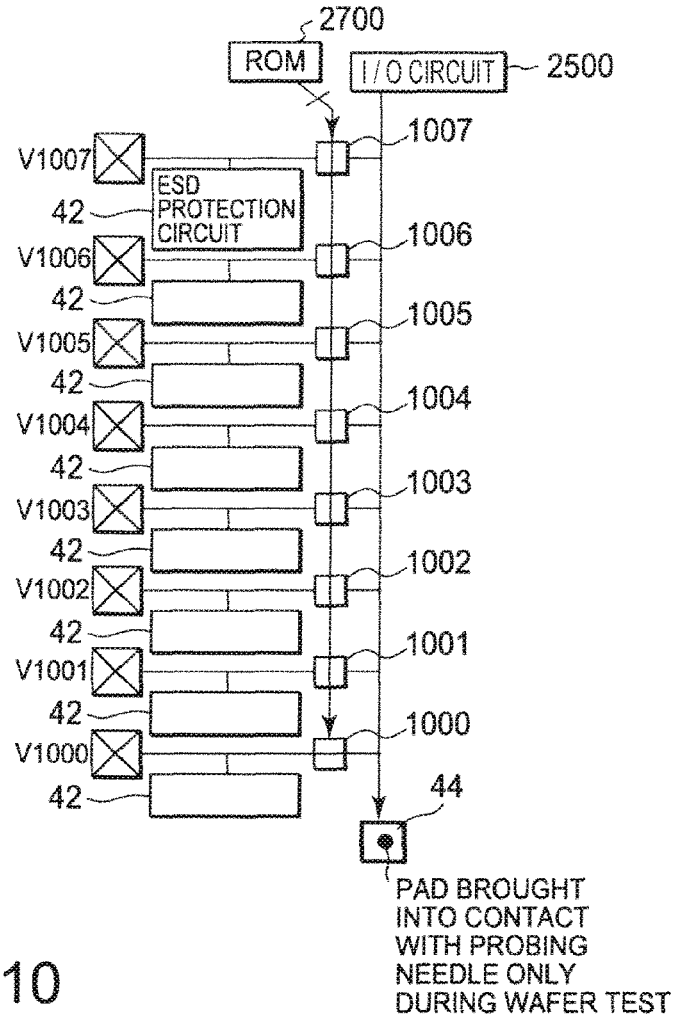
FIG. 10 is a diagram showing a semiconductor device according to a sixth embodiment of the invention and illustrating the connection positions of ESD protection circuits.

Referring to FIG. 10, a semiconductor device according to a sixth embodiment of this invention will be described. The shown semiconductor device forms a memory module. If a chip die forming a memory module comes into contact with a conductive material, human body or the like, a discharge path will be generated in a circuit to cause electrostatic discharge (ESD), possibly resulting in breakdown of the circuit. Therefore, it is a common practice in conventional memory modules such as DRAMs to provide an ESD protection circuit. However, no study has been made of an ESD protection circuit suitable for use in memory modules having stacked chip dies (stacked memory devices according to this invention).

As shown in FIG. 10, ESD protection circuits 42 are provided respectively between data signal transfer through electrodes formed in the vias V1000 to V1007 of the chip die 210 shown in FIG. 1 and the switches 1000 to 1007 connected to the data signal transfer through electrodes. The provision of the ESD protection circuits 42 in association with the respective through electrodes makes it possible to reduce significantly the circuit scale of the ESD protection circuit 42 for each chip die, and for each through electrode (connected to the terminal (BGA) of the stacked memory device).

As described above with reference to FIG. 1, the switches 1000 to 1007 are configured such that one of the eight switches is selected by the ROM 2700 (eight switch control signal lines are extended out from the ROM 2700). Therefore, when viewed from the terminals (BGA) of the stacked memory device in which a plurality of chip dies have been stacked, the same number of ESD protection circuits 42 as that of the stacked chip dies are in an operable state, which makes it possible to obtain a memory module having sufficiently high resistance against ESD after being packaged (after the assembly process).

On the other hand, when chip dies are tested on the wafer (before the assembly process), a pad 44 is provided on each chip die as shown in FIG. 10 such that the pad 44 comes into contact with a probing pin only during testing of the wafer (in the state of FIG. 4), and all the switches 1000 to 1007 are rendered conductive by turning high all the output signals from the ROM 2700 before the setting. This makes it possible to increase the capacity of a single ESD protection circuit 42 by eight times, and thus to prevent the breakdown due to ESD.

Figure 11:
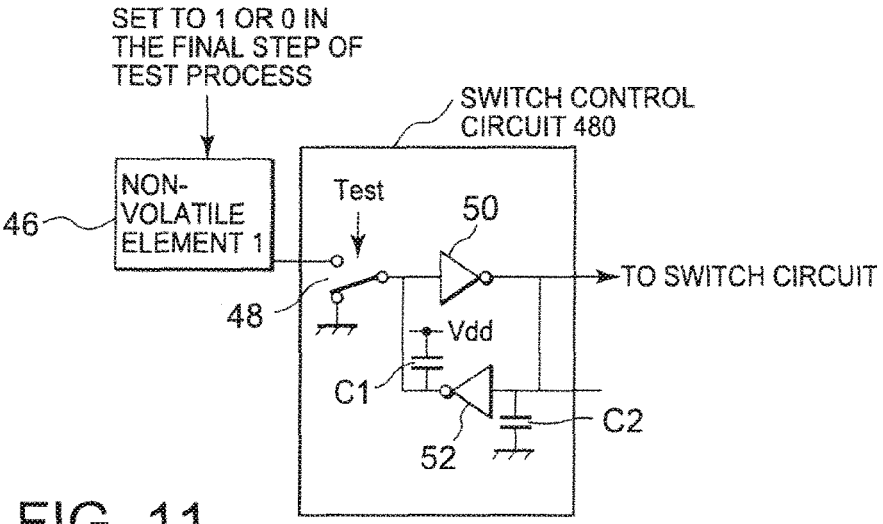
FIG. 11 is a diagram showing a test switch control circuit to be used during testing of the semiconductor device shown in FIG. 10.

FIG. 11 shows a test switch control circuit 480 for rendering all the switches 1000 to 1007 conductive before setting the ROM 2700. The shown circuit has a non-volatile element 46 which is an element of the ROM 270, a switch 48, a flip-flop formed by two inverter circuits 50 and 52, and capacitors C1 and C2. The shown switch 48 is formed by a high-voltage transistor having ESD resistance (an FET transistor having a gate insulation film with a greater thickness than that of a transistor in a general logic circuit, or an MOS/MIS-type FET transistor in which nodes of a diffusion layer are thicker or deeper than those in general transistors). The output of the inverter circuit 50 is supplied to the switches 1000 to 1007.

According to the circuit configuration shown in FIG. 11, when a test signal (Test) is given (i.e., a test signal is activated) during testing of a chip die, the switch 48 selects a low voltage side power supply (VSS), output data from the inverter 50 (information "1") is supplied to the switches 1000 to 1007 shown in FIG. 10, whereby all the switches 1000 to 1007 are made conductive, and the eight ESD protection circuits 42 are connected to the pad 44. This makes it possible to conduct a wafer test in the state in which sufficient ESD resistance is kept. In the last step of the wafer test, the non-volatile element 46 is set to information "0" (PROGRAM) or "1" (ERASE) according to ON/OFF of the corresponding switch for each type of products (see FIG. 4). After completion of the assembly process (i.e., after the product has been mounted) and when no test is conducted, the switch connects between the non-volatile element 46 and the flip-flop. Accordingly, no bus fight will occur between [IO] *I/O* circuits of different chip dies due to conduction (competition) with other switches. The test signal input to the switch 48 formed by a high voltage transistor is supplied through a probing pad (not shown). This is why the switch 48 is formed by a high voltage transistor. The capacitors C1 and C2 have functions to prevent the bus fight between [IO] *I/O* circuits of different chip dies when the power is turned on (when the external power supply VDD of the device rises in the power-up sequence) during operation of the stacked memory device after the assembly process, and to keep the output of the respective flip-flops corresponding to all the switch circuits at information "0" (Low) until the output voltage of the non-volatile element 46 is determined.

Figure 12:
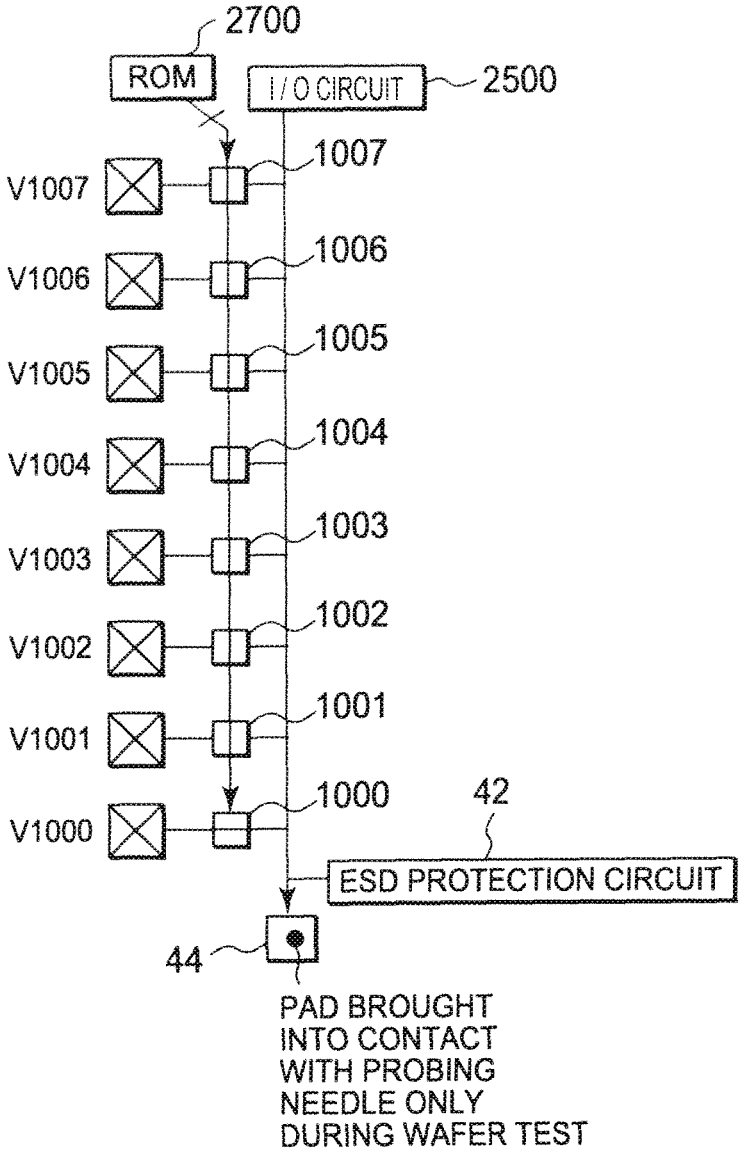
FIG. 12 is a diagram showing a modification example of the semiconductor device according to the sixth embodiment of the invention, in which the connection position of the ESD protection circuit differs from the sixth embodiment.

FIG. 12 shows a modification example of the memory module according to the sixth embodiment of the invention. This example is different from the circuit shown in FIG. 10 in that an ESD protection circuit 42 is connected to each of the [IO] *I/O* circuits 2500 of the chip dies. Like the circuit shown in FIG. 10, the provision of the ESD protection circuit 42 for each of the [IO] *I/O* circuits 2500 of the chip dies also makes it possible to reduce the circuit scale of the ESD protection circuit 42 in comparison with the conventional techniques.

Describing more specifically, when a stacked memory device has an [IO] *I/O* chip such as a controller for controlling a plurality of chip dies provided between the chip die 210 and the stacking substrate 20 (in other words, when through silicon vias (TSV) of the chip die 210 are not connected to external terminals (BGA) of the stacked memory device), there is no need of taking into consideration of human model (HM) ESD resistance, but only of man machine model (MM) ESD resistance. This makes it possible to reduce the ESD circuit scale.

Further, like the description above (FIG. 11), the test switch control circuit 480 is controlled to the low voltage side power supply (VSS) only during the wafer test (in the state shown in FIG. 4), so that all the switches 1000 to 1007 are rendered conductive and the total parasitic capacitance of the eight vias V1000 to V1007 is used as the assist capacitance for the ESD circuit. This provides further improvement in the ESD resistance.

Figure 13A:
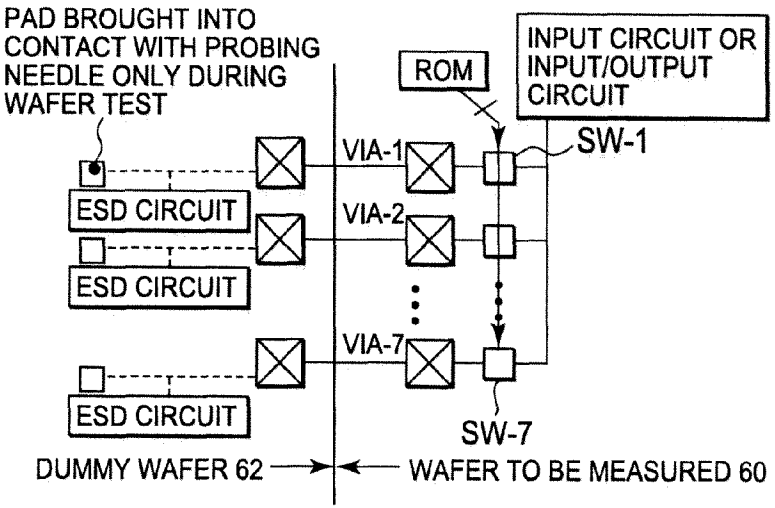
FIGS. 13A and 13B are diagrams showing a connection during a test of a semiconductor device according to a seventh embodiment of the invention and wafers used for the test.
Figure 13B:
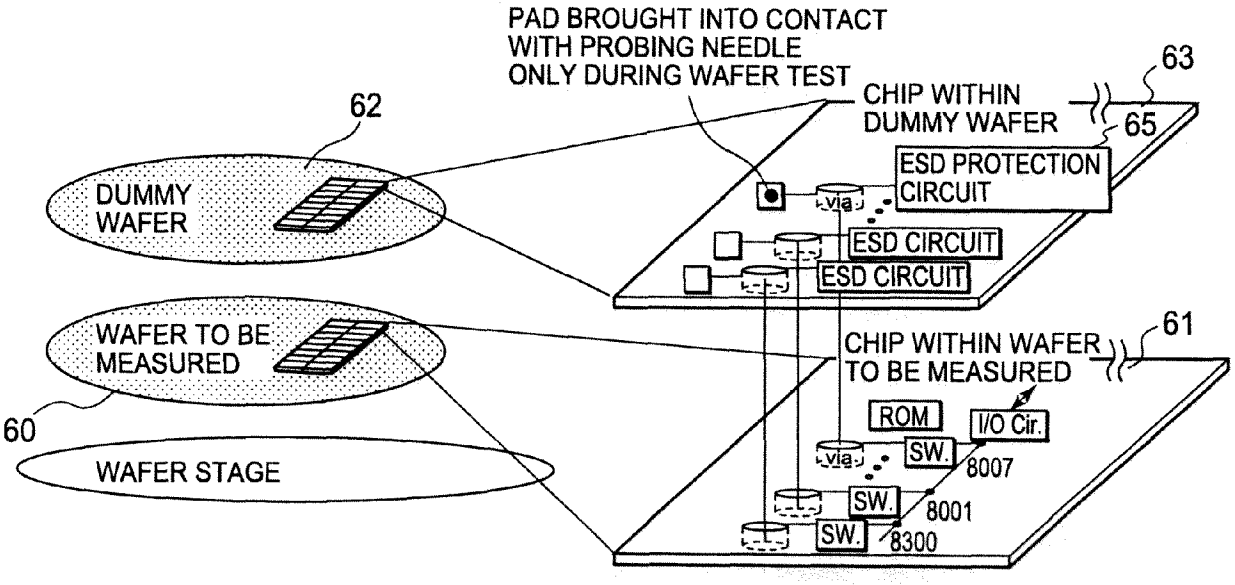

Referring to FIGS. 13A and 13B, a semiconductor device according to a seventh embodiment of this invention will be described. The semiconductor device according to this seventh embodiment has a wafer to be measured 60 on which chip dies having no ESD protection circuit are formed, and a dummy wafer 62 on which chip dies having at least an ESD protection circuit and a probing terminal mounted.

Describing more specifically, as shown in FIG. 13B, each of the chip dies 61 on the wafer to be measured 60 has, like those shown in FIG. 1, [IO] *I/O* circuits, input/output lines, a plurality of switches (SW) connected to the input/output lines, through electrodes formed in TSV vias and connected to the respective switches, and ROMs.

On the other hand, each of the chip dies 63 on the dummy wafer 62 has TSV vias formed at the same positions as those in the chip dies on the wafer to be measured 60, and ESD protection circuits 65 at least connected to the through electrodes. Further, in the chip dies 63 on the dummy wafer 62, a pad is connected to each of the through electrodes, such that the pad comes into contact with a probing needle only during a wafer test. The chip dies 63 may be mounted with other functional circuits for conducting tests.

In order to conduct a wafer test on the chip dies 61 on the wafer, to be measured 60, as shown in FIG. 13A, the wafer to be tested 60 is brought into contact (for example, into close contact) with the dummy wafer 62, so that the vias of the wafer to be tested 60 are electrically connected to the vias of the dummy wafer 62, and the probing needle is bought into contact with the pads on the dummy wafer 62. This configuration provides an advantage that there is no need of providing ESD protection circuits or probing terminals in the chip dies 61 which will be a final product.

When a memory module (stacked memory device including an [IO] *I/O* chip such as a controller) is fabricated by stacking the chip dies 61 obtained from the wafer to be measured and packaging them, the chip dies are electrically connected only to the memory controller through the vias but not connected to any terminal outside the memory module. Thus, an additional advantage is provided that the human model (HM) resistance need not be taken into consideration.

It should be understood that the invention is applicable regardless of fabrication methods and configurations of the TSVs and bumps.

Furthermore, according to this invention, it is obvious that information of the ROMs for controlling the switches or the like as disclosed here, or switch controlling information replaceable with the ROMs can be supplied by the controller to each of the chip dies stacked by means of the TSV technology.

Here are exemplary aspects of this invention.

A first aspect of this invention provides a semiconductor device including a plurality of electrodes passing through a semiconductor substrate; switches connected to the respective electrodes; first signal lines each connected in common to a plurality of the switches; and first circuits connected to the respective first signal lines, wherein only one of the switches is selectively rendered electrically conductive.

In a second aspect of this invention according to the first aspect, the invention provides the semiconductor device further including ROMs which are preset to a predetermined value for selectively rendering the switches electrically conductive.

In a third aspect of this invention according to the second aspect, the invention provides the semiconductor device wherein the ROMs are set in association with groups which at least data signals of the semiconductor device belong to.

In a fourth aspect of this invention according one of the first to third aspects, the invention provides the semiconductor device further including second switches for connecting a plurality of the first signal lines to one of the first circuits.

In a fifth aspect of this invention according to the fourth aspect, the invention provides the semiconductor device further including second ROMs which are preset to a predetermined value for selectively rendering the second switches electrically conductive, wherein it is set in the second ROMs whether data is compressed or not.

In a sixth aspect of this invention according to one of the first to fifth aspects, the invention provides the semiconductor device wherein each of the first signal line has a probing terminal which is used only during probing.

In a seventh aspect of this invention according to the sixth aspect, the invention provides the semiconductor device including an ESD protection circuit connected to each of the first signal lines.

In an eighth aspect of this invention according to one of the first to sixth aspects, the invention provides the semiconductor device including ESD protection circuits respectively connected to the plurality of electrodes.

In a ninth aspect of this invention according one of the first to eighth aspects, the invention provides the semiconductor device including a third switch and a latch circuit between the switches and the ROM.

In a tenth aspect of this invention according to the ninth aspect, the invention provides the semiconductor device wherein the third switch is supplied, by a test signal, with an input of a control signal to render the third swich electrically conductive.

In an eleventh aspect of this invention according to the tenth aspect, the invention provides the semiconductor device wherein a plurality of the electrodes are connected to the first signal lines by activation of the test signal.

In a twelfth aspect of this invention according to the first aspect, the invention provides the semiconductor device including ESD protection circuits respectively connected to the plurality of electrodes, and a third switch and a latch circuit between the switches and the ROM, wherein the third switch is rendered electrically conductive by a test signal, and a plurality of the ESD circuits are connected to the first signal lines by activation of the test signal.

In a thirteenth aspect of this invention according to the first aspect, the invention provides the semiconductor device wherein each of the first circuits has a plurality of output transistors for driving the first signal lines, and a control signal is supplied to change the number of the output transistors to be activation-controlled according to the number of the semiconductor devices stacked.

In a fourteenth aspect of this invention according to the thirteenth aspect, the invention provides the semiconductor device further including a third ROM, the control signal being connected to the third ROM.

In a fifteenth aspect of this invention according to the first aspect, the invention provides the semiconductor device wherein the operating power supply voltage of the first circuits is changeable according to the number of stacked semiconductor devices.

In a sixteenth aspect of this invention according to the fifteenth embodiment, the invention provides the semiconductor device wherein each of the first circuits is a circuit for inputting and outputting stored information, and the stored information of multiple bits (I/O) is formed by a plurality of the electrodes.

In a seventeenth aspect of this invention, the invention provides a semiconductor device having a semiconductor substrate provided with a plurality of electrodes passing through the substrate, wherein the semiconductor substrate has switches connected to the respective electrodes, first signal lines each connected in common to a plurality of the switches, and first circuits connected to the respective first signal line, and is designed such that one of the plurality of the switches is selectively made electrically conductive, and wherein a plurality of the semiconductor substrates are stacked, the electrodes are connected to each other, and the switches selectively made conductive are located at mutually different positions among the semiconductor substrates.

In an eighteenth aspect of this invention according to the seventeenth aspect, the invention provides the semiconductor device wherein the electrodes connected to the respective switches made conductive at the mutually different positions form memory information of multiple bits (I/O).

In a nineteenth aspect of this invention according to the seventeenth aspect, the invention provides the semiconductor device wherein the electrodes connected to the respective switches made conductive at the mutually different positions form an activation select group (CS0, CS1 or CLK) for the semiconductor substrates.

In a twentieth aspect of this invention according to one of the seventeenth to nineteenth aspects, the invention provides the semiconductor device having a second semiconductor substrate (controller chip) for controlling a plurality of the semiconductor substrates, wherein the mutually connected electrodes of the plurality of the semiconductor substrate are connected to electrodes of the second semiconductor substrate.

In a twenty-first aspect of this invention according to the twentieth aspect, the invention provides the semiconductor device wherein the electrodes of the second semiconductor substrate are connected to external electrodes of the semiconductor device.

In a twenty-second aspect of this invention according to the twentieth or twenty-first aspect, the invention provides the semiconductor device wherein ESD circuits are respectively connected to the stacked and mutually connected electrodes.

In a twenty-third aspect of this invention according the seventeenth aspect, the invention provides the semiconductor device wherein each of the first circuits has a plurality of output transistors for driving the first signal lines, and the semiconductor device further has a control signal for changing the number of the output transistors to be activation controlled according the number of the stacked semiconductor substrates.

In a twenty-fourth aspect of this invention according to the seventeenth aspect, the invention provides the semiconductor device wherein the operating power supply voltage of the first circuits is changeable according to the number of the stacked semiconductor substrates.

Although the above description of the exemplary embodiments of the invention has been made in terms of a case in which the invention is applied to a memory module formed of a DRAM, this invention is applicable not only to DRAM (volatile memory) but also to other semiconductor devices formed by stacking chips, for example a semiconductor device formed by stacking nonvolatile memories. For example, the semiconductor device including the memory chips of the invention may include other types of chips. Such chips may, for example, be a controller chip for controlling a plurality of memory chips performing high-bandwidth data communication through the memory chips and TSVs according to this invention. Specifically, such other types of chips include a CPU (Central Processing Unit), an MCU (Micro Control Unit), a DSP (Digital Signal Processor), an ASIC (Application Specific Integrated Circuit), an ASSP (Application Specific Standard Circuit) and so on. This invention is applicable in general to semiconductor products including these chips. A device to which this invention is applied is applicable to semiconductor devices such as a POP (Package on Package) or the like. Transistors used in the memory cells or logic circuits may be field effect transistors (FETs), and are applicable not only to an MOS (Metal Oxide Semiconductor) but also to various FETs such as an MIS (Metal-Insulator Semiconductor), and a TFT (Thin Film Transistor). Some of the transistors may be the types of transistors than FETs. Further, P-channel type transistors or PMOS transistors forming a so-called CMOS logic circuit are representative examples of first conduction type transistors, while N-channel type transistors or NMOS transistors are representative examples of second conduction type transistors. Further, the semiconductor substrates are not limited to P-type semiconductor substrates, but may be N-type semiconductor substrates, semiconductor substrates of an SOI (Silicon on Insulator) structure, or even other types of semiconductor substrates.

According to this invention, the degree of freedom in design can be improved by combining chip dies having the same configuration. Further, according to this invention, the data transfer speed of the memory module as a whole can be increased without the need of increasing the data transfer speed from the chip dies, which provides an advantage that the consumption current of the chip dies can be reduced. Still further, the chip dies can be operated at a low operating frequency, and thus the manufacturing yield of the chip dies can be enhanced.

What is claimed is:

1. A method of testing a semiconductor device comprising;

providing a first wafer that comprises a first surface, a second surface that is allocated at an opposite side of the first surface, a first electrode penetrating the first wafer from the first surface to the second surface, and a pad formed on the first surface and coupled electrically with the first electrode;

providing a second wafer that comprises a second electrode penetrating the second wafer;

stacking the first wafer onto the second wafer to connect the first electrode with the second electrode such that the second surface of the first wafer faces the second wafer;

probing a needle to the pad; and supplying, in such a state that the first wafer is stacked on the second wafer, a test signal to the first electrode to input the test signal into the second wafer via the first electrode and the second electrode.

2. The method as claimed in claim 1, wherein:

a circuit to be tested is included in the second wafer; and the test signal is supplied to the circuit via the first electrode and the second electrode.

3. The method as claimed in claim 2, wherein the second wafer further comprises a switch that is formed between the second electrode and the circuit.

4. The method as claimed in claim 3, wherein the switch connects the second electrode with the circuit when the semiconductor device is under test.

5. The method as claimed in claim 1, wherein the pad is connected directly with the first electrode.

6. The method as claimed in claim 5, wherein the first wafer further comprises an electrostatic discharge (ESD) protection circuit that is connected directly with the first electrode.

7. The method as claimed in claim 1, wherein the providing the second wafer comprises stacking a plurality of wafers, each of the plurality of wafers having a substantially identical structure.

8. The method as claimed in claim 1, wherein the test signal is supplied to the needle, the test signal being supplied to the first electrode via the needle and the pad.

9. A method of producing a tested semiconductor device comprising:

forming a semiconductor device; and testing the semiconductor device, the testing including:

stacking a first wafer onto a second wafer having the semiconductor device such that a first electrode formed on the first wafer is connected with a second electrode formed on the second wafer, the first electrode penetrating the first wafer, the second electrode penetrating the second wafer and being coupled electrically with the semiconductor device; and supplying a test signal to the first electrode of the first wafer to input the test signal into the semiconductor device via the first electrode and the second electrode.

10. The method as claimed in claim 9, wherein the second wafer comprises a switch that is formed between the second electrode and the semiconductor device.

11. The method as claimed in claim 10, wherein the switch connects the second electrode with the semiconductor device when the semiconductor device is under test.

12. The method as claimed in claim 9, wherein the testing further includes probing a needle to a pad that is formed on the first wafer and is coupled electrically with the first electrode.

13. The method as claimed in claim 12, wherein the test signal is supplied to the needle, the test signal being supplied to the first electrode via the needle and the pad.

14. The method as claimed in claim 9, wherein the first wafer comprises an electrostatic discharge (ESD) protection circuit that is connected directly with the first electrode.

15. The method as claimed in claim 9, wherein the second wafer comprises a plurality of stacked wafers, each of the plurality of stacked wafers having a substantially identical structure.

16. A method of producing a semiconductor device comprising:

stacking a plurality of semiconductor chips, wherein each of the plurality of semiconductor chips has already been tested by a testing method, the testing method including;

stacking a first wafer onto a second wafer comprising the semiconductor chip such that a first electrode formed on the first wafer is connected with a second electrode formed on the second wafer, the first electrode penetrating the first wafer, the second electrode penetrating the second wafer and being connected electrically with the semiconductor chip; and supplying a test signal to the first electrode of the first wafer to input the test signal into the semiconductor chip via the first electrode and the second electrode.

17. The method as claimed in claim 16, wherein:

a circuit to be tested is included in the semiconductor chip of the second wafer; and the test signal is supplied to the circuit via the first electrode and the second electrode.

18. The method as claimed in claim 17, wherein:

the second wafer comprises a switch that is formed between the second electrode and the circuit; and the switch connects the second electrode with the circuit when the circuit is under test.

19. The method as claimed in claim 16, wherein the first wafer comprises an electrostatic discharge (ESD) protection circuit that is connected directly with the first electrode.

20. The method as claimed in claim 16, wherein the second wafer comprises a plurality of stacked wafers, each of the plurality of stacked wafers having a substantially identical structure.

*21. A semiconductor device comprising:*

*a plurality of chips each comprising:*

*a substrate having a first surface and a second surface opposite the first surface;*

*a plurality of through electrodes penetrating the substrate from the first surface to the second surface;*

*a test pad connected to a first through electrode of the plurality of through electrodes; and*

*a circuit to be tested;*

*wherein the plurality of chips are stacked and interconnected through the plurality of electrodes, and test access is provided to the circuit to be tested on each of the plurality of chips through the test pad on a first chip of the plurality of chips.*

*22. The semiconductor device as claimed in claim 21, wherein the test pad on the first chip is connected to the circuit to be tested on a second chip of the plurality of chips through a switch.*

*23. The semiconductor device as claimed in claim 22, wherein the switch connects the test pad on the first chip to the first through electrode on the first chip.*

*24. The semiconductor device as claimed in claim 22, wherein the switch connects the first through electrode on the second chip to the circuit to be tested on the second chip.*

* * * * *